(12) United States Patent
Kato et al.

(10) Patent No.: US 7,952,726 B2
(45) Date of Patent: May 31, 2011

(54) MEASUREMENT APPARATUS, EXPOSURE APPARATUS HAVING THE SAME, AND DEVICE MANUFACTURING METHOD

(75) Inventors: Seima Kato, Utsunomiya (JP); Chidane Ouchi, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 455 days.

(21) Appl. No.: 12/280,926

(22) PCT Filed: Feb. 28, 2007

(86) PCT No.: PCT/JP2007/054373
§ 371 (c)(1),
(2), (4) Date: Aug. 27, 2008

(87) PCT Pub. No.: WO2007/100144
PCT Pub. Date: Sep. 7, 2007

(65) Prior Publication Data
US 2010/0190115 A1    Jul. 29, 2010

(30) Foreign Application Priority Data
Feb. 28, 2006   (JP) ............... 2006-051426

(51) Int. Cl.
G01B 9/02 (2006.01)
G03B 27/54 (2006.01)
(52) U.S. Cl. ........................ 356/521; 355/67
(58) Field of Classification Search .............. 355/67; 356/499, 515, 521
See application file for complete search history.

(56) References Cited

U.S. PATENT DOCUMENTS

| | | | |
|---|---|---|---|
| 6,650,421 B2* | 11/2003 | Magome | 356/521 |
| 6,707,560 B1* | 3/2004 | Naulleau et al. | 356/515 |
| 2003/0197865 A1 | 10/2003 | Shiode | |
| 2004/0114119 A1 | 6/2004 | Van Der Laan et al. | |
| 2005/0117171 A1* | 6/2005 | Kato | 356/521 |
| 2005/0219549 A1* | 10/2005 | Hasegawa | 356/515 |
| 2006/0044569 A1* | 3/2006 | Kato | 356/515 |

FOREIGN PATENT DOCUMENTS

| | | |
|---|---|---|
| EP | 1403714 A2 | 3/2004 |
| JP | 62-193120 A | 8/1987 |
| JP | 09-298140 A | 11/1997 |
| JP | 2002-071514 A | 3/2002 |
| JP | 2003-254725 A | 9/2003 |
| JP | 2004-014865 A | 1/2004 |
| JP | 2004-289116 A | 10/2004 |
| JP | 2006-196699 A | 7/2006 |
| JP | 2006-332586 A | 12/2006 |
| WO | 03/088329 A1 | 10/2003 |

OTHER PUBLICATIONS

International Search Report issued on Apr. 24, 2007 for International Application No. PCT/JP2007/054373.

* cited by examiner

Primary Examiner — Hung Henry Nguyen
Assistant Examiner — Steven H Whitesell-Gordon
(74) Attorney, Agent, or Firm — Rossi, Kimms & McDowell LLP

(57) ABSTRACT

A measurement apparatus includes a first mask that is arranged on an object plane of a target optical system, and has a window that transmits measurement light, a second mask that has a reflection surface for reducing coherence of the measurement light, and a diffraction grating configured to split the measurement light that has been reflected on the second mask, has passed the first mask and the target optical system, wherein a distance Lg between the diffraction grating and an image plane of the target optical system satisfies $Lg = m \cdot Pg^2 / \lambda$ where Pg is a grating pitch of the diffraction grating, $\lambda$ is a wavelength of the measurement light, and m is an integer except for 0.

5 Claims, 14 Drawing Sheets

MEASUREMENT APPARATUS, EXPOSURE APPARATUS HAVING THE SAME, AND DEVICE MANUFACTURING METHOD

TECHNICAL FIELD

The present invention relates to a measurement apparatus and an exposure apparatus.

BACKGROUND ART

A conventional projection exposure apparatus projects a circuit pattern of a reticle (mask) onto a wafer via a projection optical system in manufacturing a semiconductor device using the photolithography technology. A practice of a projection exposure apparatus that uses the EUV light having a wavelength between about 5 nm and 20 nm ("EUV exposure apparatus" hereinafter) smaller than a wavelength of the ultraviolet light is studied so as to meet the demand for the fine processing of a semiconductor device.

In order to precisely transfer a reticle pattern onto a wafer at a predetermined magnification, the projection optical system needs a high imaging characteristic with few aberrations. However, along with the recent fine processing to the semiconductor device, the projection exposure apparatus cannot sometimes previously transfer the reticle pattern onto the wafer under the influence of the aberration of the projection optical system. Therefore, there is a demand for a precise measurement of the wavefront aberration of the projection optical system.

A lateral shearing interferometer ("LSI") is one known apparatus that can precisely measure the wavefront aberration of the projection optical system applied to the EUV light, without the precise alignment that is required for a point diffraction interferometer. The LSI generally arranges a pinhole mask having one pinhole on an object plane of a target optical system. A pinhole image images on an image plane under the aberrational influence of the target optical system. A diffraction grating is arranged between the image plane and the target optical system to shear the wavefront in two orthogonal directions. As a result, an interference pattern is obtained on an observation plane subsequent to the image plane. When the wavefront information obtained from wavefront data in each direction is integrated, a two-dimensional wavefront is restored.

In order to take from a pinhole the light enough intensified for the wavefront measurement, the light from a high luminance light source should be condensed onto the pinhole. An undulator light source inserted into the electron storage ring is a conceivable high luminance light source, but requires bulk facility and increases the cost. In the assembly process and the installation at the designation of the exposure apparatus, the light source for the wavefront measurement is preferably small and common to the exposure light source.

On the other hand, the light from an exposure light source, such as a laser produced plasma light source ("LPP") and a discharge produced plasma light source ("DPP"), has low directivity, and a difficulty in condensing onto the pinhole. Therefore, use of the exposure light source for the wavefront measurement result in a very small amount of the light that transmits the pinhole, and cannot provide the interference image necessary to measure the wavefront on the observation plane.

One proposed solution for the improvement of the light use efficiency to arrange a one-dimensional reflection-type grating on the object plane of the target optical system. See Japanese Patent Application, Publication No. ("JP") 2005-079592. This reflection-type has a structure (reflection area) with a random height. Instead of arranging one pinhole on the object plane, the reflection area is wide enough to improve the light use efficiency. Moreover, JP 2005-079592 arranges a diffraction grating at an image plane position of the target optical system. In the wavefront measurement, the reflection-type grating is moved in parallel to the lines in order to restrain the speckles generated from the reflection-type grating, and then a phase of the diffraction grating is shifted to calculate a shearing wavefront or difference wavefront among the diffracted beams so as to calculate the wavefront of the target optical system.

However, the LSI using the phase shift generally needs to photograph plural interference images while shifting a phase difference among the diffracted beams of respective orders by a specific amount, and while changing shift directions. Thus, JP 2005-079592 needs to photograph two pairs of interference images, and requires a long time for measurements. Moreover, unless an optical element, such as a diffraction grating, is extremely stably held during shifting (or unless it is moved without changing the height direction), a measurement error occurs.

DISCLOSURE OF INVENTION

The present invention provides a measurement apparatus that can measure a wavefront of the target optical system quickly, inexpensively, and precisely.

A measurement apparatus according to one aspect of the present invention includes a first mask that is arranged on an object plane of a target optical system, and has a window that transmits measurement light, a second mask that has a reflection surface for reducing coherence of the measurement light, and a diffraction grating configured to split the measurement light that has been reflected on the second mask, has passed the first mask and the target optical system, wherein a distance Lg between the diffraction grating and an image plane of the target optical system satisfies $Lg=m \cdot Pg^2/\lambda$ where Pg is a grating pitch of the diffraction grating, $\lambda$ is a wavelength of the measurement light, and m is an integer except for 0, and wherein a wavefront aberration of the target optical system is calculated from an interference pattern formed through interference of the measurement light split by the diffraction grating.

Other features and advantages of the present invention will be apparent from the following description given in conjunction with the accompanying drawings, in which like reference characters designate the same or similar parts throughout the figures thereof.

BEST MODE FOR CARRYING OUT THE INVENTION

Figure 1:
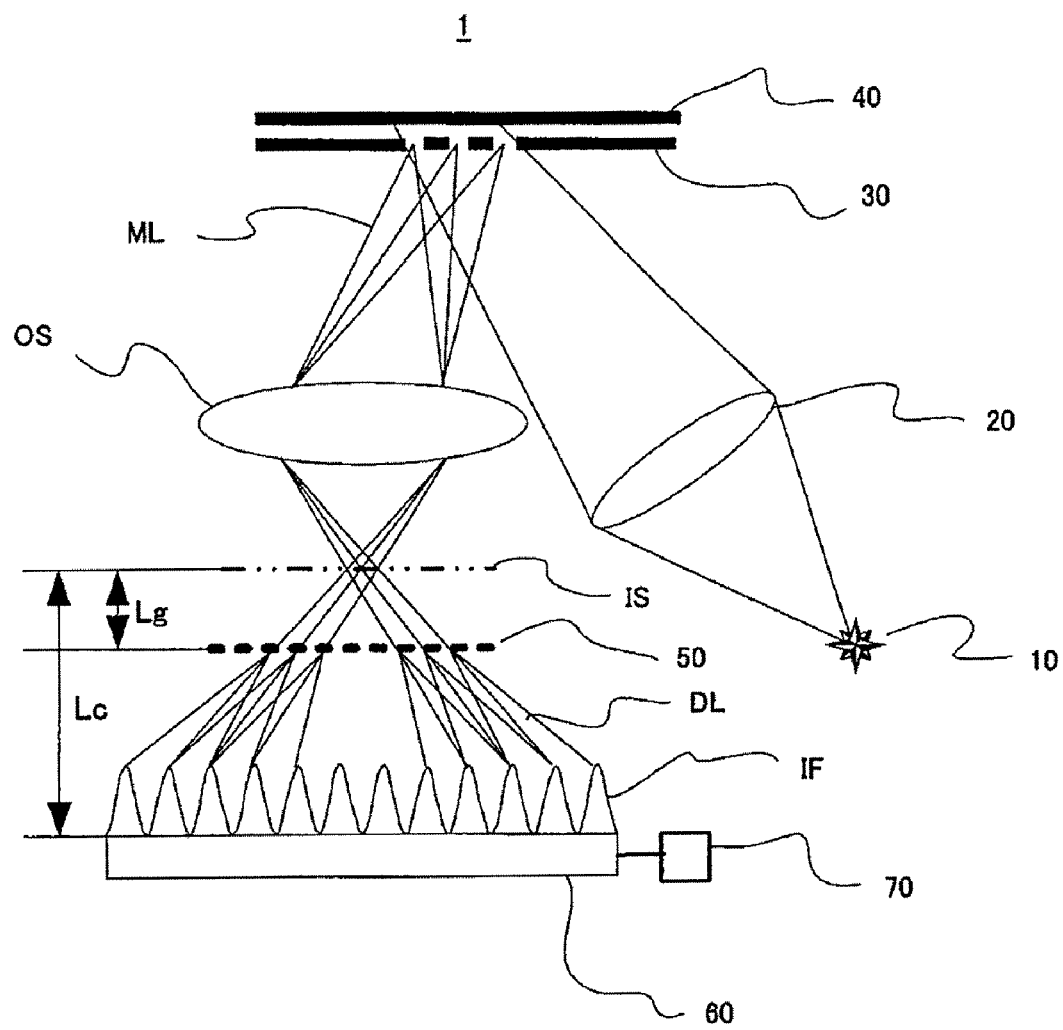
FIG. 1 is a schematic sectional view of a basic arrangement of a measurement apparatus according to one aspect of the present invention.

Referring now to the accompanying drawings, a description will be given of a preferred embodiment of the present invention. In each figure, those elements which are the same as corresponding element are designated by the same reference numerals, and a duplicate description will be omitted.

First Embodiment

FIG. 1 is a schematic sectional view of a basic arrangement of a measurement apparatus 1 according to one embodiment of the present invention. The measurement apparatus 1 is a measurement apparatus that measures an optical element (in particular, a wavefront aberration) of a target optical system OS (which is a projection optical system in a EUV exposure apparatus in the first embodiment).

In FIG. 1, 10 denotes an exposure light source of the EUV projection exposure apparatus. The light from the exposure light source passes an illumination optical system 20 of the EUV exposure apparatus, and illuminates a (first) mask 30 arranged on the object plane of the projection optical system OS. The mask 30 has many transmission windows that transmit the light.

40 denotes a (second) reflection mask that has a rough reflection surface configured to reduce the coherency of the light, and is arranged near the object plane of the projection optical system OS. The rough reflection surface, as used herein, means a reflection surface that can reduce the coherency of the measurement light.

The measurement light ML emitted from the window of the mask 30 is condensed onto an image plane IS of the projection optical system OS via the projection optical system OS.

The EUV exposure apparatus is mounted with the measurement apparatus 1, and arranges a wafer as a photosensitive substrate on the image plane IS during exposure, but does not arrange the wafer in measuring the wavefront of the projection optical system OS (or in a measurement mode) so that the condensed light from the projection optical system OS can pass the image plane IS.

Due to the two-dimensional diffraction grating 50, the light ML that has passed the image plane IS becomes multiple diffracted beams DL, which are detected as an interference pattern IF on a subsequent detector 60. The detector 60 serves as observation means for observing or detecting the interference pattern, and is a camera or detector, such as a rear surface irradiation type CCD.

Figure 2:
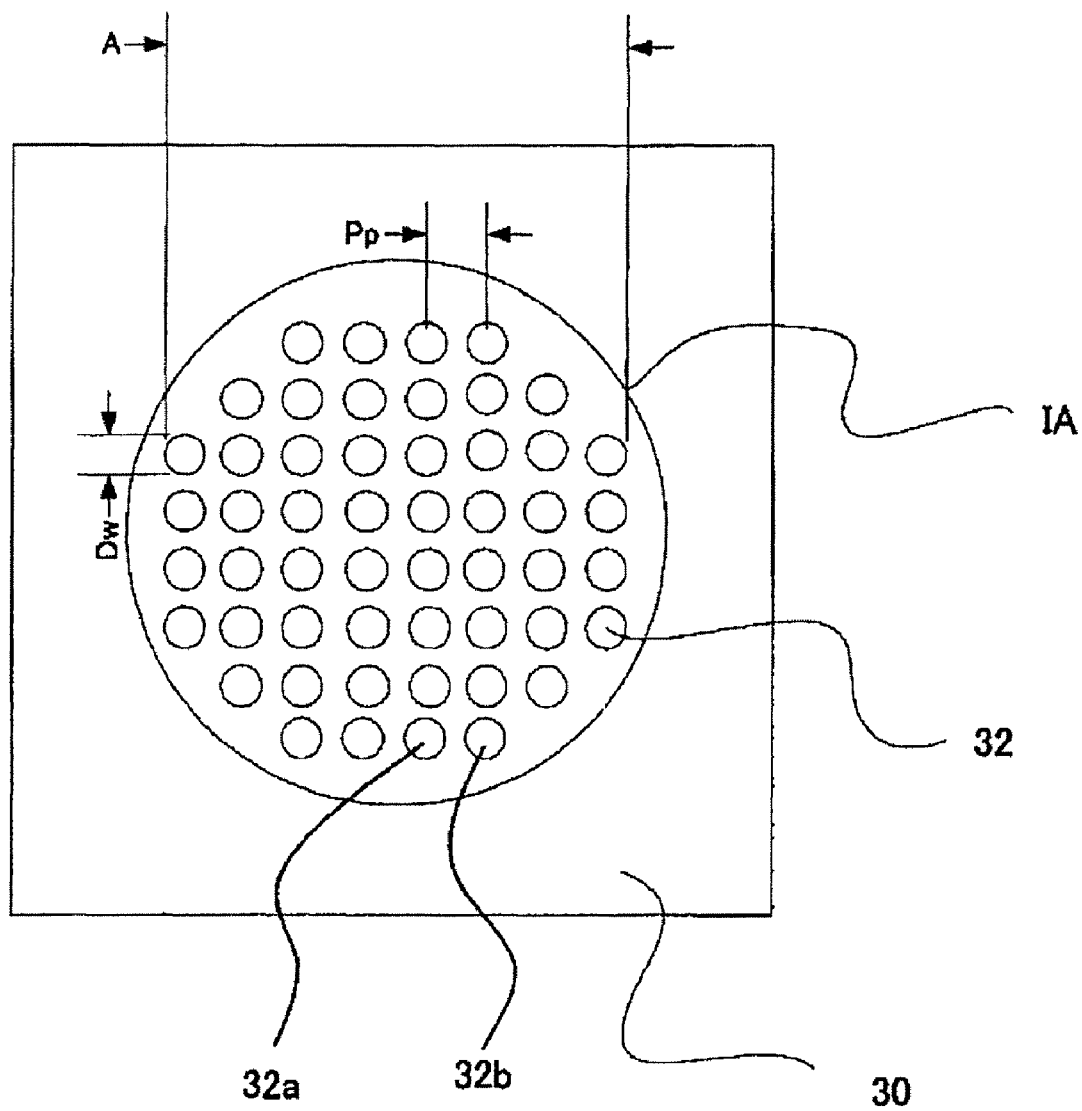
FIG. 2 is a plane view of a detailed structure of a first mask shown in FIG. 1.

The first embodiment arranges plural transmission windows on the mask 30 on the object plane of the target optical system OS in order to improve the light use efficiency from the exposure light source 10. FIG. 2 is a plane view of a detailed structure of the mask 30. Referring to FIG. 2, plural transmission windows 32 each having a diameter Dw are arranged at intervals of Pp on the mask 30. The mask 30 may be made of any material as long as the material can shield the light from the exposure light source 10. This embodiment uses low-expansion glass applied on nickel (Ni), tantalum (Ta), chrome (Cr) or a compound of them.

FIG. 3 is a sectional view of one illustrative sectional structure of a reflection mask 40. Referring to FIG. 3, the reflection mask 40 has a structure having a set of fine reflection areas. Each reflection area is designed to provide a phase difference of 1 λ or greater to the reflected light.

Figures 3A, 3B:
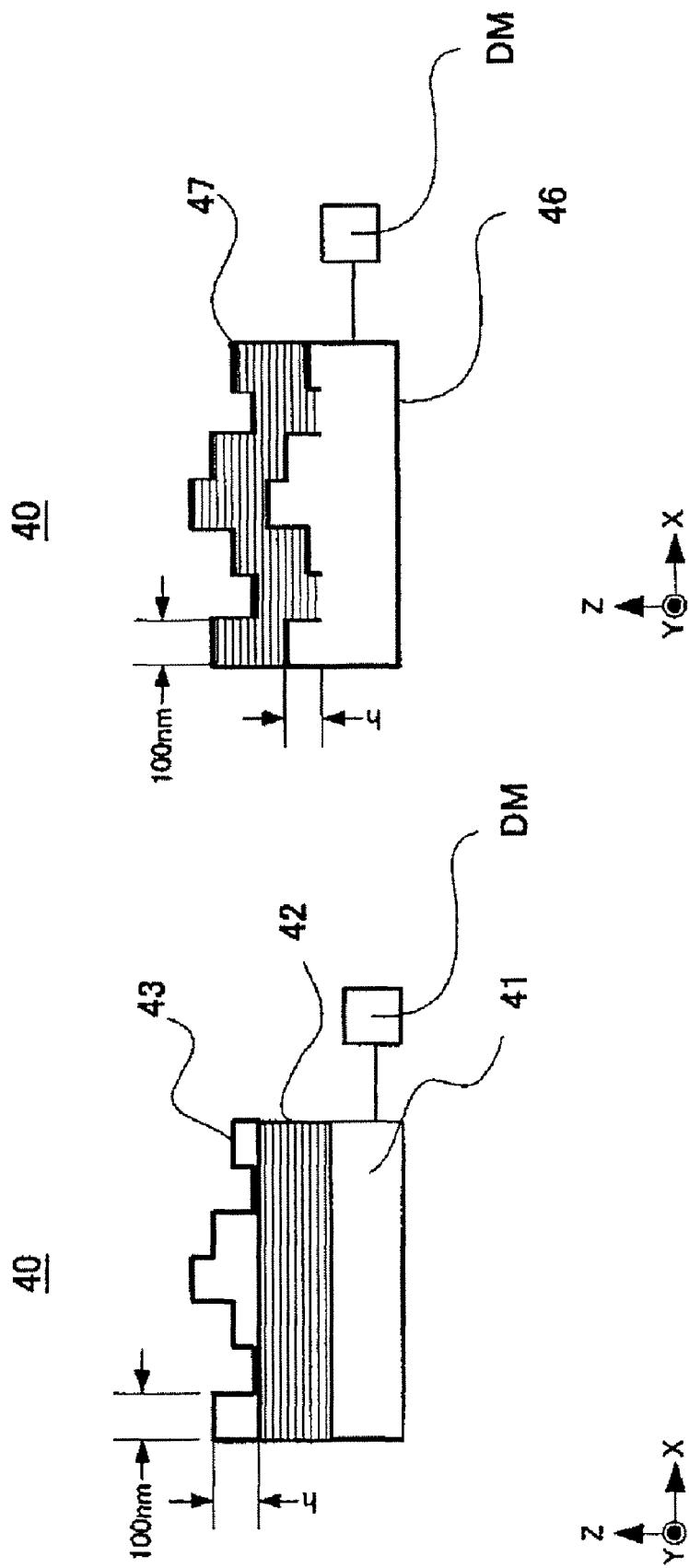
FIG. 3 is a sectional view of one illustrative sectional structure of a second mask shown in FIG. 1.

A detailed description will be given of the structure of the reflection mask 40. The mask 40 shown in FIG. 3A has a reflecting multilayer film 42 on a substrate 41, and a relief structure 43 on the multilayer film 42 so as to provide a reflection phase difference. The relief structure 33 is designed to has a size of about 100 nm in the X and Y directions and has a height h in the Z direction, as shown in FIG. 3A. The height h is a random numerical value for each convex and concave. The height h is determined by the material of the relief structure 43, and has a size that provides a phase difference of 1 λ or greater on the reflection position on the relief structure. For example, when the relief structure is made of molybdenum (Mo), h may be a random numerical value of 100 nm or greater.

The mask 40 shown in FIG. 3B is configured to have a reflecting multilayer film 47 on the substrate 46 having a relief structure. The relief structure of the substrate 46 has a size of about 100 nm in the X and Y direction, and a height h in the Z direction. The Z direction is a random numerical value for each convex and concave. When the height h is several tens nanometers or greater, a phase difference of 1 λ or greater occurs among each convex and concave. The reflection mask 40 is arranged on a stage different from a stage for the object plane of the target optical system OS (or the mask 30), and driven in the X and Y directions by a driving mechanism DM shown in FIGS. 3A and 3B. In other words, the mask 40 is arranged on the stage that is driven independently of the mask 30.

The interferometer that arranges a pinhole on the object plane of the target optical system can measure the wavefront emitted from the pinhole as if it is a spherical wave. On the other hand, the first embodiment arranges a transmission window greater than the pinhole on the object plane of the target optical system, and has a problem in that the illumination light (measurement light) incident upon the target optical system contains the aberration of the illumination optical system. This is because the beams that transmit two different points on the transmission window have coherency. Accordingly, the first embodiment makes uniform the aberration of the illumination optical system on the reflection mask 40, which is contained in the illumination light or measurement light that passes the transmission window 32.

More specifically, in order to eliminate or reduce the coherency at two different points on the transmission window 32, the detector 60 detects the interference pattern by driving the reflection mask 40 in one direction or another direction. When the driving amount of the mask 40 is sufficiently large relative to the acquisition time of the interference pattern of the detector 60, the integral values of the beams that pass two different points on the transmission window 32 are incoherent. Thereby, without aberrational influence of the illumination optical system, the wavefront aberration of the projection optical system OS as the target optical system can be measured.

When the mask 30 having the transmission windows 32 and the reflection mask 40 are integrated, the contrast of the interference pattern deteriorates in accordance with the mask's driving amount when the interference pattern is measured by driving the integrated mask. It is conceivable to measure the interference pattern by stepping for each interval of a window of the integrated mask, but the measurement time period becomes long. On the other hand, this embodiment fixes the transmission window 32 (mask 30), and a moving amount of the rough reflection surface (mask 40) is not restricted, effectively providing an interference pattern that has no aberration of the illumination optical system through one measurement.

The driving speed of the reflection mask 40 depends upon the acquisition time period of the image (interference pattern) of the detector 60, as long as the light that passes one point on the window 32 is generated from the reflected light from the relief structure 43 enough for the integral time period of the detector 60. For example, if the reflected beams from the relief structure having 100 convexes and concaves are sufficient, the reflection mask 40 may be driven at a speed of 100 μm/sec or greater when the acquisition time period of the image of the detector 60 is 1/10 seconds. A driving direction of the driving mechanism DM in which the reflection mask 40 is driven may be only the X direction or the Y direction. Since the reflection mask 40 does not have to be precisely driven, the driving mechanism DM may be a rough-movement motor.

A conceivable manufacturing method of the reflection mask 40 is precision processing, chemical processing, and polishing. A manufacture of the mask 40 using the precision processing needs very complicated processing, possibly requiring the high-precision processing, and increasing the cost of the mask 40. A manufacture of the mask 40 using chemical processing may erode the surface of the mask 40 due to acid, but can make the mask 40 relatively inexpensively given the processing condition that can provide the desired relief structure. Alternatively, polishing can form desired structures of the relief structure 43 and the substrate 46 having the relief structure.

A detailed description will be given of a structure of the mask 30 arranged on the object plane of the projection optical system OS. In general, the wavefront aberration of the window 32a on the transfer area of the projection optical system OS is different from the wavefront aberration of the window 32b at a different position, the difference increases as a distance between the windows 32a and 32b increases. The interference pattern changes correspondingly. The interference pattern generated by the light emitted from the window 32a is generally different from that generated by the light emitted from the window 32b different from the window 32a, and the difference increases as the distance between the windows 32a and 32b increases. Hence, the area A in which the window 32 distributes needs to be limited to an area that is considered to have substantially the same aberration of the projection optical system OS. The area A of the plural windows 32 in the first embodiment has an area that is considered to have substantially the same aberration of the projection optical system OS, typically ranges between a diameter of about 0.1 mm and about 1 mm. Of course, the same effect can be obtained even when the area A of the plural windows is larger than the above area as long as the illumination area IA is limited to the above diameter.

Figure 4:
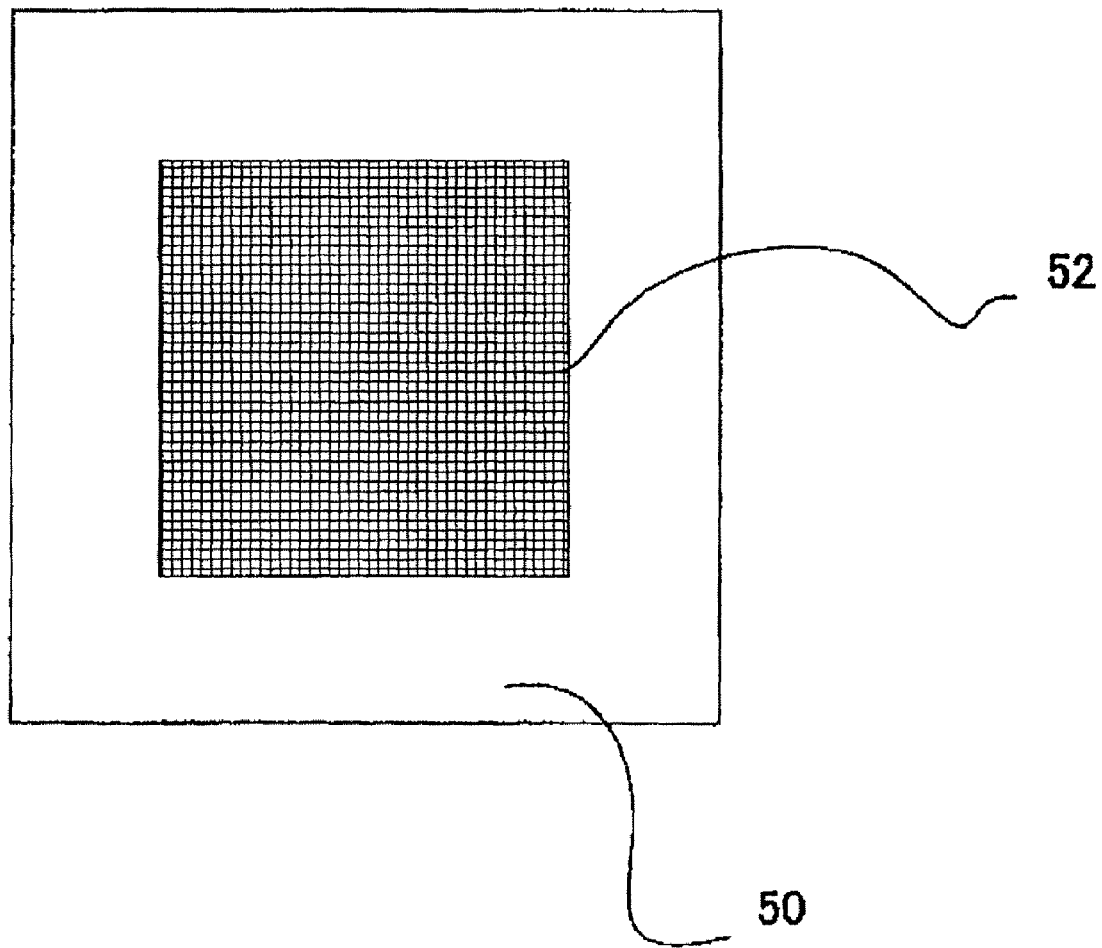
FIG. 4 is a plane view of a structure of a diffraction grating shown in FIG. 1.

FIG. 4 is a plane view of a structure of the diffraction grating 50. The diffraction grating 50 includes a two-dimensional diffraction grating 52, as shown in FIG. 4. The two-dimensional diffraction grating 52 is an element that splits the light from the projection optical system OS into plural diffracted beams DL. FIG. 1 shows only the 0-th order light and ±1st order diffracted beams among the diffracted beams generated by the two-dimensional diffraction grating 52. In order to obtain a high contrast interference pattern, a distance Lg between the two-dimensional diffraction grating 52 and the image plane IS needs to satisfy Equation 1 below so as to provide a Talbot effect, where Pg is a grating pitch of the diffraction grating, λ is a wavelength of the measurement light, and m is an integer except 0.

$$Lg = m \cdot Pg^2/\lambda \qquad \text{[EQUATION 1]}$$

In the mask 30, the interval of plural windows 32 is set to an interval that enables the bright and dark interference patterns to accord with each other. Thereby, a highly intensified interference pattern with enough for the measurement can be obtained without lowering the contrast of the interference pattern.

Figure 5:
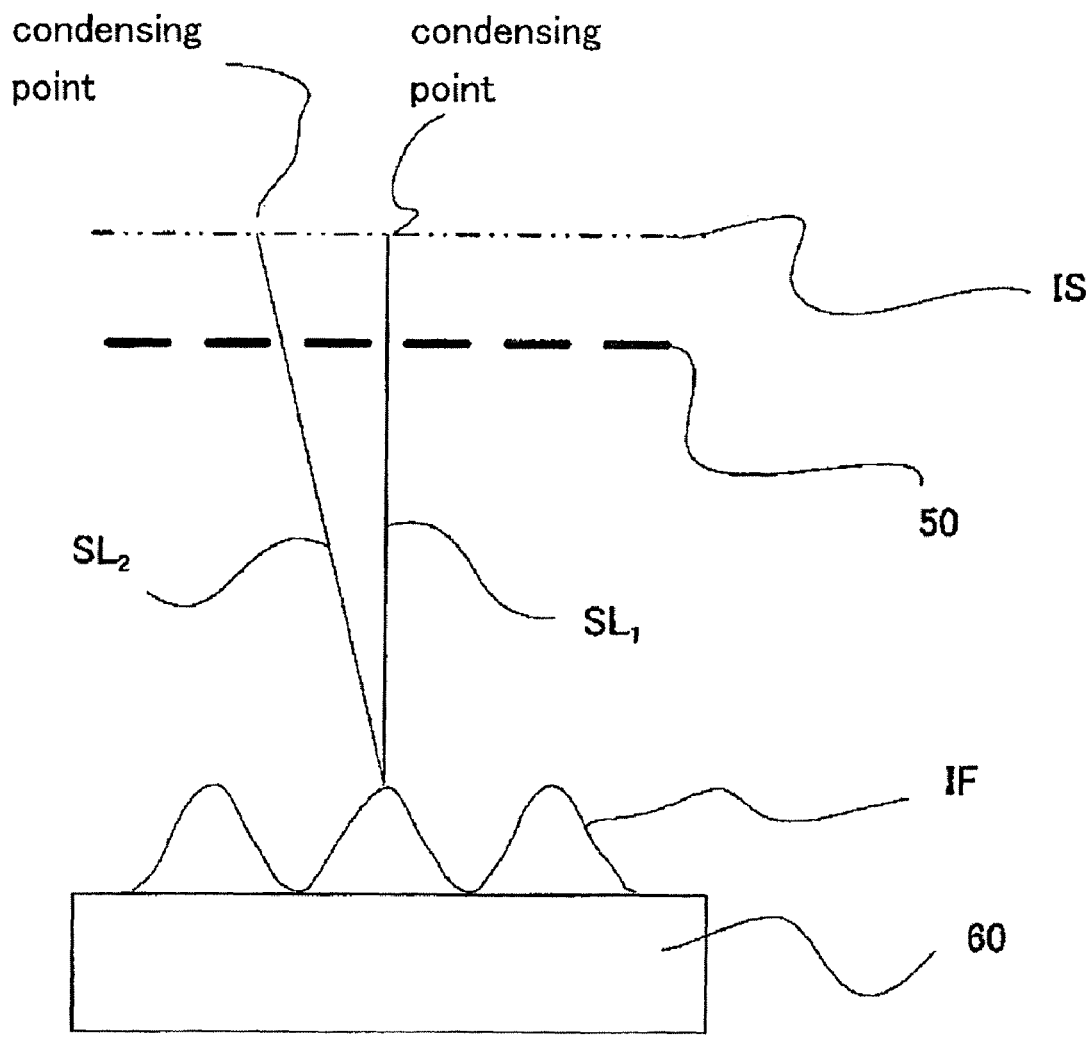
FIG. 5 is a view showing a relationship between an image point of a target optical system (or a projection optical system) and the diffraction grating shown in FIG. 1.

On the line that connects the center of the aperture of the two-dimensional diffraction grating 52 to the condensing point on the image plane IS of the light emitted from each window 32, the bright and dark interference patterns accord with each other. As shown in FIG. 5, two lines $SL_1$ and $SL_2$ that connect a specific pixel on the detector 60 to adjacent condensing points on the image plane IS are designed to pass the adjacent apertures on the diffraction grating 50 (two-dimensional diffraction grating 52). In other words, a relationship between the grating pitch Pg of the diffraction grating and an image period Pi of each window 32 satisfies Equation 2 below, where Lc is a distance between the image plane IS of the projection optical system OS and the detector 60. Here, FIG. 5 is a view showing a relationship between the image point of the projection optical system OS and the diffraction grating 50.

$$Pi = Pg \cdot Lc/(Lg+Lc) \qquad \text{[EQUATION 2]}$$

The interval Pp of the window 32 is expressed by Equation 3 below, where β is a magnification of the projection optical system OS:

$$Pp = Pi/\beta \qquad \text{[EQUATION 3]}$$

Figure 6:
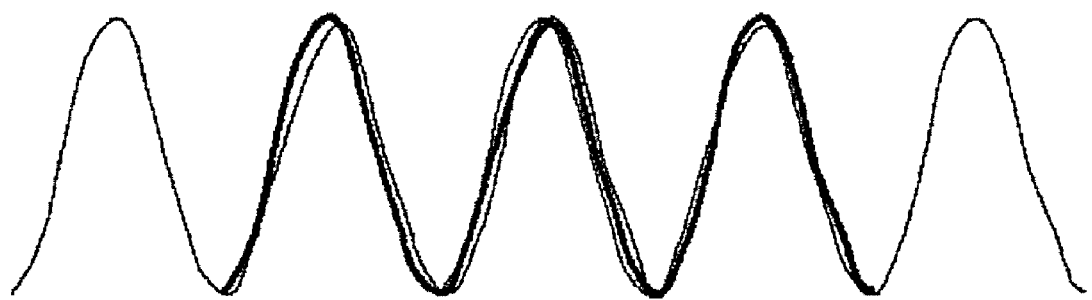
FIG. 6 is a view of one illustrative interference pattern on a detector shown in FIG. 1.

Therefore, when the interval Pp of the window 32 satisfies Equation 4 below, the bright and dark positions of the interference pattern resulting from the light emitted from any windows 32 can accord with each other on the detector 60. As a result, as shown in FIG. 6, the bright and dark parts of the interference pattern generated from each window 32 overlap each other, preventing the contrast deterioration. Here, FIG. 6 is a view of one illustrative interference pattern on the detector 60.

$$Pp = \frac{Pg}{\beta} \cdot \frac{Lc}{Lg+Lc} \qquad \text{[EQUATION 4]}$$

While FIG. 1 shows the diffraction grating 50 under the image plane IS, the diffraction gratin 50 may be located above the image plane IS, although Lg becomes negative.

In addition, if the detector 60 is sufficiently distant from the image plane IS, or a distance between the detector 60 and the image plane IS is sufficient, Lc/Lg+Lc may be regarded as 1 and the following Equation 5 may be approximated:

$$Pp = Pg/\beta \quad \text{[EQUATION 5]}$$

As a diameter Dw of the window 32 increases, the light use efficiency improves but the contrast of the interference pattern detected or observed by the detector 60 deteriorates. Therefore, the diameter Dw of the window 32 is properly determined based on the intensity and the contrast deterioration of the interference pattern. One suitable and illustrative method of determining the diameter Dw of the window 32 sets the diameter Dw to 2.1 μm with a permissible contrast amount of the interference pattern of 60% or greater, because the diameter Dw of the window 32 is 0.6 times the window interval Pp.

Turning back to FIG. 1, 70 denotes a calculator that calculates or analyzes the interference pattern. The interference pattern IF is a two-dimensional pattern, and the Fourier transformation method is more suitable for the phase restorer than the phase difference method. The Fourier transformation method can calculate shearing wavefronts in both longitudinal and lateral directions from one two-dimensional interference pattern, remarkably shortening a measurement time period without influence by the element's vibrations in principle.

The calculator 70 restores a phase using the Fourier transformation method, and an integral wavefront from the shearing wavefronts. One restoration method from the shearing wavefronts is, for example, to calculate a differential wavefront in two orthogonal directions of the diffraction gratings, to integrate each differential wavefront in the above two directions, and to synthesize them. Another restoration method from the shearing wavefronts is, for example, to calculate the differential wavefronts in two orthogonal directions of the diffraction grating 50, to fit each differential function using a differential function, and to calculate a coefficient of the differential function.

The first embodiment discusses with the projection optical system as the target optical system used for the EUV exposure apparatus. However, the measurement apparatus 1 is applicable to any wavelengths as long as the optical elements are replaced in accordance with the wavelength of the light source, and can measure the wavefront aberration of any imaging or target optical system.

Second Embodiment

Figure 7:
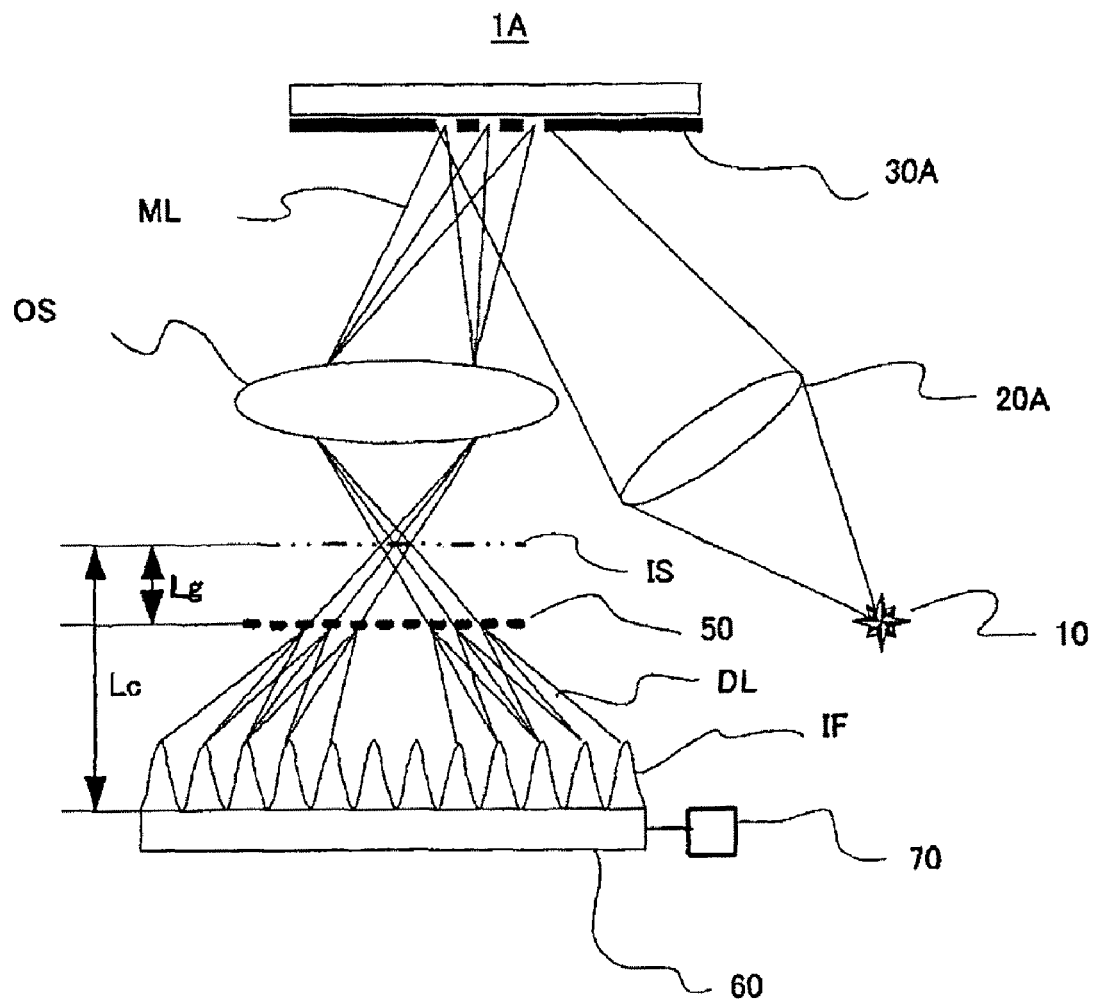
FIG. 7 is a schematic sectional view of a basic arrangement of a measurement apparatus according to another aspect of the present invention.

FIG. 7 is a schematic sectional view of a basic arrangement of a measurement apparatus 1A according to another embodiment of the present invention. The measurement apparatus 1A has no reflection mask 40 that has the rough reflection surface, differently from the measurement apparatus 1 of the first embodiment. In comparison with the measurement apparatus 1 of the first embodiment, the measurement apparatus 1A is made of the same elements and lenses as those in the measurement apparatus 1 except that the object plane IS of the projection optical system OS as the target optical system and the illumination optical system 20A that illuminates the object plane IS have different structures.

Figure 8:
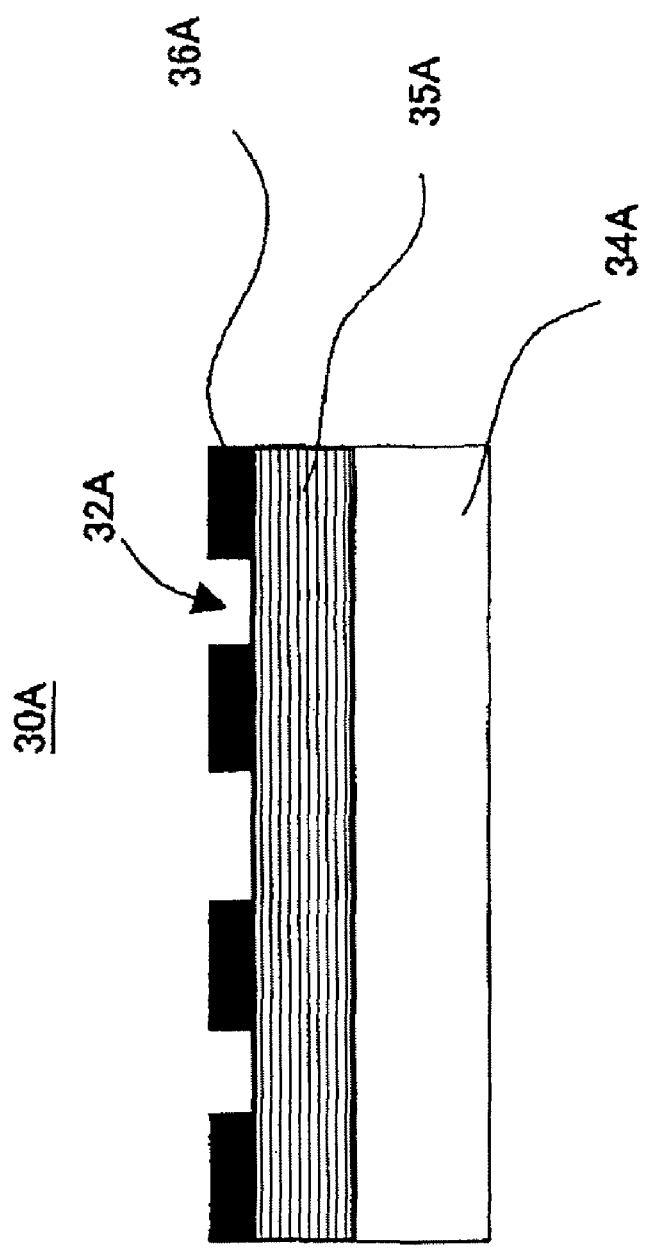
FIG. 8 is a schematic sectional view of a structure of a mask shown in FIG. 7.

FIG. 8 is a schematic sectional view of a structure of a reflection mask 30A arranged on the object plane of the projection optical system OS. The mask 30A has a Mo/Si multilayer film 35A on a substrate 34A which is layered by the light shielding member 36A. The light shielding member 36A has plural windows 32A, and the arrangement of the plural windows 32A is similar to that in FIG. 2.

Figure 9:
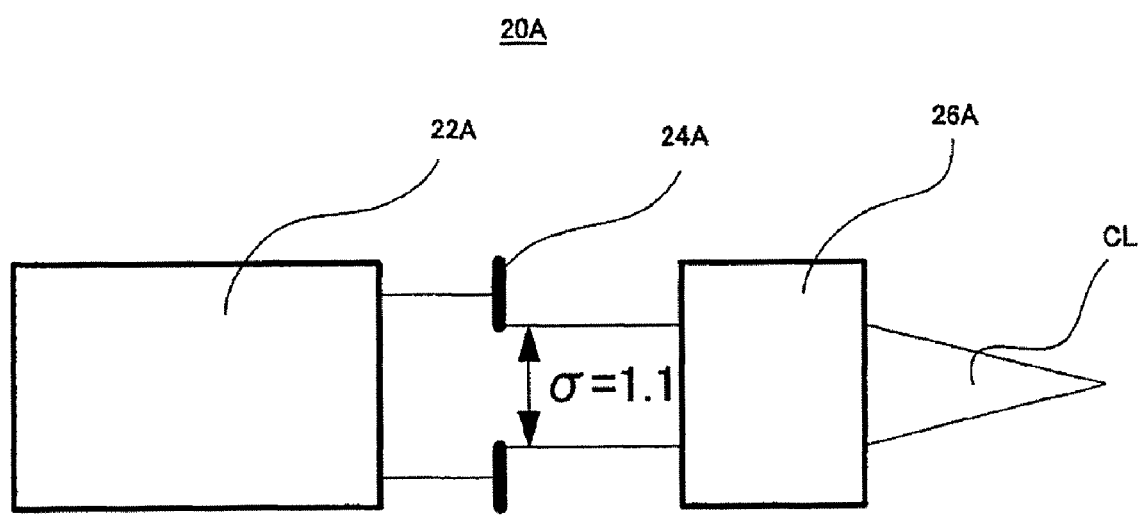
FIG. 9 is a schematic sectional view of one illustrative structure of an illumination optical system shown in FIG. 7.

FIG. 9 is a schematic sectional view of one illustrative structure of the illumination optical system 20A. The illumination optical system 20A includes a mirror unit 22A, an aperture stop 24A, and a condenser system 24A. The light that has passed the mirror unit 22A that receives the light from the exposure light source 10 is condensed by the condenser system 26A via the aperture stop 24A, and becomes condensed light CL that illuminates the object plane of the target optical system OS. The aperture stop 24A can enlarge an aperture up to σ=1.1. In addition, the mirror unit 22A and the condenser system 26A serve to optimize the light intensity distribution in accordance with the aperture of the aperture stop 24A. The illumination optical system 20A is designed to make the exposure light source 10 conjugate with the pupil of the projection optical system OS. Here, σ is a ratio of a numerical aperture ($NA_{il}$) of the illumination optical system 20A to a numerical aperture ($NA_{ob}$) of the target optical system at the object side, as expressed by Equation 6 below:

$$\sigma = NAil/NAob \quad \text{[EQUATION 6]}$$

The coherent distance L on the object plane of the projection optical system OS is expressed by Equation 7 below:

$$L = 0.61 \times \lambda / NAil \quad \text{[EQUATION 7]}$$

When there is a sufficiently small light source on the object plane of the projection optical system OS, an ideal spherical wave is generated from the object plane. Equation 8 below defines a diameter D of the light source on the object plane which is considered to be sufficiently small to the projection optical system OS:

$$D = 0.61 \times \lambda / NAob \quad \text{[EQUATION 8]}$$

Therefore, when $L \leq D$ is met, the object plane can be regarded as a set of fine incoherent light sources. In other words, the mask 30A on the object plane of the projection optical system OS emits the light that is not affected by the aberration of the illumination optical system 20A.

The second embodiment illuminates the object plane (mask 30A) of the projection optical system OS with σ=1.1 in measuring the wavefront aberration of the projection optical system OS. As long as the object plane of the projection optical system OS is illuminated with σ of 1 or greater, a similar effect can be obtained.

The object plane of the projection optical system OS can be illuminated substantially with σ=1.1 even when the illumination optical system 20A does not provide an illumination with σ=1.1 if the optical element in the illumination optical system 20A, such as a mirror in the mirror unit 22A, is vibrated.

Figure 10:
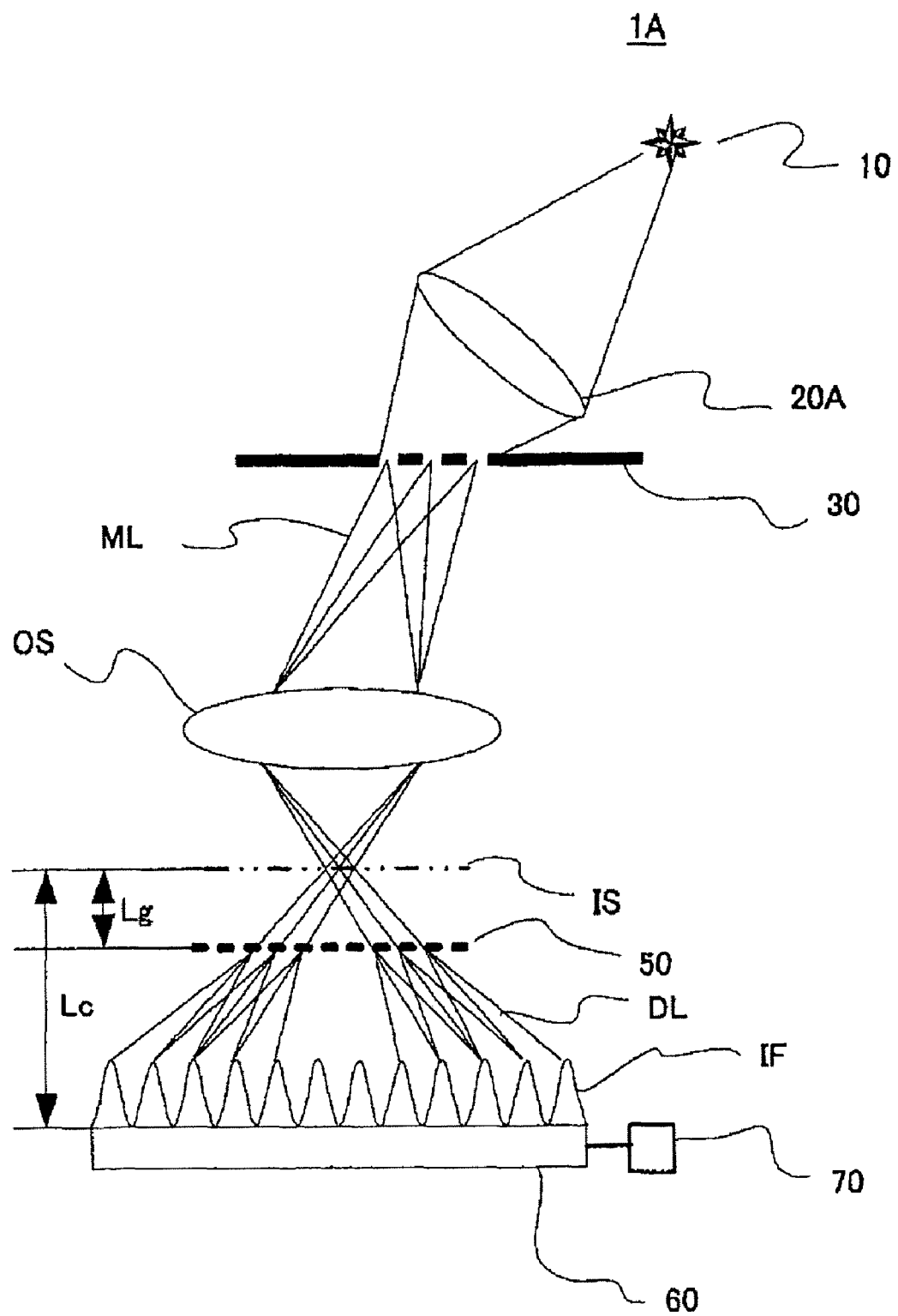
FIG. 10 is a schematic sectional view of a structure of the measurement apparatus shown in FIG. 7 that has a transmission mask.

The reflection mask 30A may be replaced with the transmission mask 30, as shown in FIG. 10. FIG. 10 is a schematic sectional view of a structure of the measurement apparatus that has the transmission mask 30.

Third Embodiment

Figure 11:
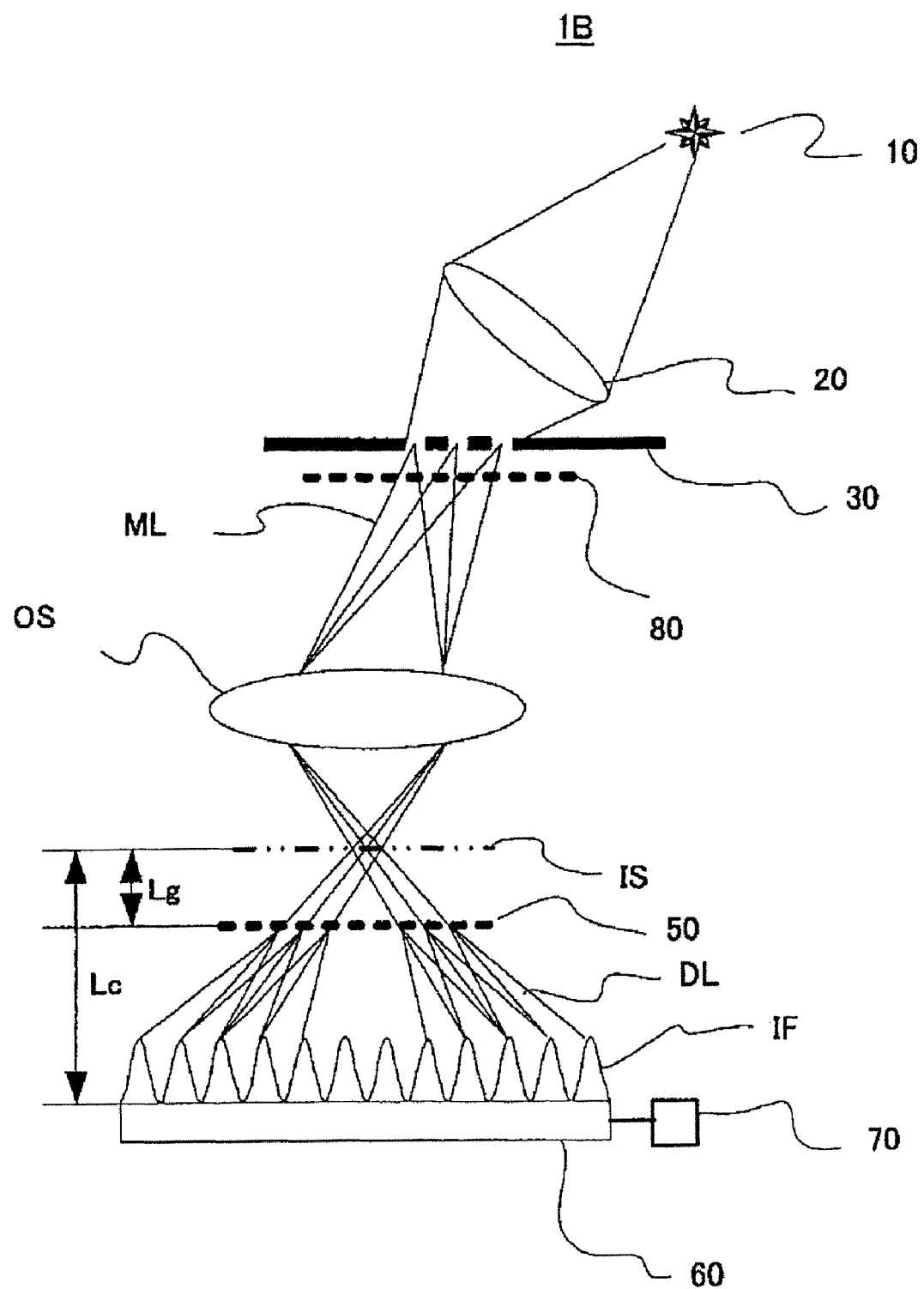
FIG. 11 is a schematic sectional view of a basic arrangement of a measurement apparatus according to still another embodiment of the present invention.

FIG. 11 is a schematic sectional view of a basic arrangement of a measurement apparatus 1B according to still another embodiment of the present invention. The measurement apparatus 1B replaces the illumination optical system 20A with the illumination optical system 20 in the measurement apparatus 1A of the second embodiment shown in FIG. 10. The measurement apparatus 1B includes a (first) diffraction grating 80 between the projection optical system OS and the transmission mask 30 on the object plane of the projection optical system OS.

The measurement apparatus 1B takes only the aberration of the projection optical system OS through two measurement results, and measures the wavefront aberration of the projection optical system OS. More specifically, the measurement apparatus 1B does not arrange the diffraction grating 80 in the first measurement, and detects the interference pattern formed through interference between beams split by the second diffraction grating 50. The interference pattern contains the aberration of the illumination optical system 20 in addition to that of the projection optical system OS. Next, the measurement apparatus 1B does not arrange the diffraction grating 50 in the second measurement, and detects the interference pattern through interference between the beams split by the diffraction grating 80. The interference pattern contains the aberration of the illumination optical system 20 in addition to that of the projection optical system OS at a ratio different from the first measurement.

A description will now be given of a method for calculating only the aberration of the projection optical system OS through these two measurements, or a process by the calculator 70. A phase map P1 analyzed by the interference pattern obtained in the first measurement contains the shearing wavefront of the aberration Wp of the projection optical system OS and the shearing wavefront of the aberration Ws of the illumination optical system 20. When these shearing amounts are referred to as s1 and s2, the phase map P1 obtained in the first measurement is expressed by Equation 9 below:

$$P1 = Wp(x+s1) - Wp(x) + Ws(x+s2) - Ws(x) \quad \text{[EQUATION 9]}$$

Similarly, Equation 10 below expresses the phase map P2 obtained in the second measurement, where s3 is a shearing amount of the shearing wavefront of the projection optical system OS obtained in the second measurement, and s4 is a shearing amount of the shearing wavefront of the illumination optical system 20 obtained in the second measurement.

$$P2 = Wp(x+s3) - Wp(x) + Ws(x+s4) - Ws(x) \quad \text{[EQUATION 10]}$$

In general, when the shearing amount s of the shearing wavefront is small, Equation 11 below is established:

$$W(x+s) - W(x) = s\frac{\partial W}{\partial x} \quad \text{[EQUATION 11]}$$

Equations 9 and 10 are converted into Equation 12 by using Equation 11:

$$\begin{cases} P1 = s1\dfrac{\partial Wp}{\partial x} + s2\dfrac{\partial Ws}{\partial x} \\ P2 = s3\dfrac{\partial Wp}{\partial x} + s4\dfrac{\partial Ws}{\partial x} \end{cases} \quad \text{[EQUATION 12]}$$

When the simultaneous equation in Equation 12 is solved, the differential wavefront $\partial Wp/\partial x$ and wavefront Wp of the projection optical system OS is obtained as indicated by Equation 13 below:

$$\frac{\partial Wp}{\partial x} = \frac{s2s4}{s1s4 - s2s3}\left(\frac{P1}{s2} - \frac{P2}{s4}\right) \quad \text{[EQUATION 13]}$$

$$Wp = \int\left\{\frac{s2s4}{s1s4 - s2s3}\left(\frac{P_1}{s2} - \frac{P_2}{s4}\right)\right\}dx$$

Thus, the measurement apparatuses 1 to 1B improve the light use efficiency of the exposure light source 10, utilize interference, and can measure the wavefront of the projection optical system quickly, inexpensively, and precisely.

Fourth Embodiment

Figure 12:
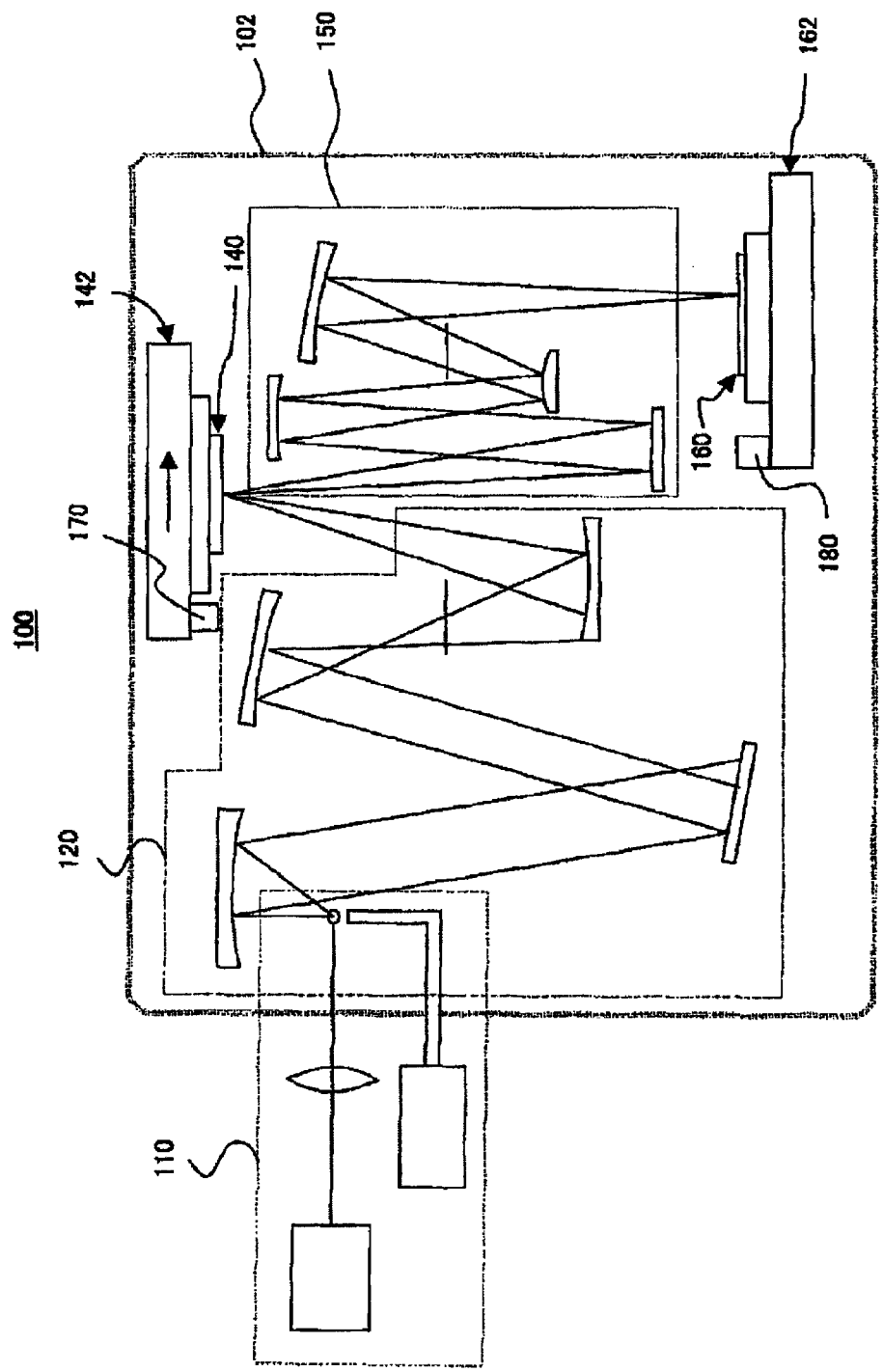
FIG. 12 is a schematic block diagram showing a structure of an exposure apparatus according to one aspect of the present invention.

Referring now to FIG. 12, a description will be given of an exposure apparatus 100 according to one aspect of the present invention. FIG. 12 is a schematic block diagram showing a structure of the exposure apparatus 100 according to the present invention. The exposure apparatus 100 utilizes the EUV light for the exposure light, but the present invention does not limit the exposure light to the EUV light.

The exposure apparatus 100 includes, as shown in FIG. 12, a light source section 110, an illumination optical system 120, a reticle stage 142 mounted with a reticle 140, a projection optical system 150, a wafer stage 162 mounted with a wafer 160, an object-side unit 170 that includes the mask 30 and the mask 40 shown in FIG. 1, and an image side unit 180 that includes the diffraction grating 50, the detector 60, and the calculator 70 shown in FIG. 1. In other words, the exposure apparatus 100 is mounted with the measurement apparatus 1 that includes an object-side unit 170, and an image-side unit 180. While the exposure apparatus 100 of the fourth embodiment is mounted with the measurement apparatus 1, it may be mounted with the measurement apparatus 1A or 1B.

The exposure apparatus 100 is a projection exposure apparatus that exposes a pattern of the reticle (photomask) 140 onto the wafer 40 utilizing the EUV light (such as the wavelength of 13.5 nm) as the exposure light in a step-and-scan manner. Since the transmittance of the EUV light is low to air, the illumination optical system 120 and the projection optical system 150 are housed in a vacuum chamber 102.

The light source section 110 is a light source that oscillates the EUV light, and uses the DPP EUV light source that generates the EUV light by generating plasma of Xe gas and Sn vapor through discharging. The light source section 110 may use the LPP EUV light source that generates the EUV light by irradiating the high-output pulsed laser to Xe and Sn, and generating the plasma. The measurement apparatus 1 uses the light source section 110 as an exposure light source of the exposure apparatus for the wavefront measurement. The apparatus becomes smaller and less expensive than a measurement apparatus that uses an undulator light source.

The illumination optical system 120 is an optical system that propagates the EUV light and illuminates the reticle 140. The illumination optical system 120 includes, for example, a condenser mirror and an optical integrator. When the exposure apparatus 100 is mounted with the measurement apparatus 1A, the illumination optical system 120 includes, as shown in FIG. 9, a mirror unit 22A, an aperture stop 24A, and a condenser system 26A.

The reticle 140 is a reflection reticle, and has a circuit patter to be transferred. The reticle 140 is supported and driven by the reticle stage 142. The projection optical system 150 reflects and projects onto the wafer 160 the diffracted light from the reticle 140.

In measuring the wavefront of the projection optical system 150, the object-side unit 170 (or the masks 30 and 40 of the measurement apparatus 1) is arranged instead of the reticle 140. The masks 30 and 40 are arranged on a dedicated stage for the wavefront aberration measurement or the reticle stage 142 so that the masks 30 and 40 can be independently driven as described above. The light from the object-side unit 170 passes the projection optical system 150 and images on the image plane of the projection optical system 150.

The projection optical system 150 serves to project the reticle pattern onto the wafer 160, and serves as a target optical system for the measurement apparatus 1. The projection optical system 150 is a coaxial optical system that includes plural multilayer mirrors, and designed to have a non-telecentric object side, and a telecentric image side. The multilayer mirror in the projection optical system 150 can improve the use efficiency of the EUV light when the number of mirrors is small, but the aberration correction becomes difficult. The number of multilayer mirrors necessary for the correction is four to six. A reflection surface shape of the multilayer mirror is spherical or aspheric convex or concave surface. The NA is between about 0.1 and about 0.3.

Since the projection optical system 150 used for the EUV light is extremely sensitive to the positional precision and thermal deformations, it is necessary to feedback-control a mirror position based on the measurement result. In addition, phase changes occur due to so-called contaminations when the impurities are adhered to the multilayer mirror in the projection optical system 150 and cause chemical reactions. Therefore, the wavefront aberration of the projection optical system 150 needs to be measured with the exposure wavelength in the exposure apparatus body, and the exposure apparatus 100 that is mounted with the measurement apparatus 1 satisfies this requirement.

A photoresist is applied to a surface of the wafer 160. This embodiment uses the wafer 160 for a photosensitive substrate, but may use a glass plate and a liquid crystal substrate instead of the wafer.

The wafer stage 162 supports and drives the wafer 160. The wafer stage 160 can use any structure known in the art, and a detailed description of its structure and operation will be omitted.

The image-side unit 180 is arranged on the image plane of the projection optical system 150. The image-side unit 180 of this embodiment is mounted on the wafer stage 162, and includes the diffraction grating 50, the detector 60, and the calculator 70, as described above.

The image-side unit 180 can move in the direction perpendicular to the optical axis by the wafer stage 162. The light from the masks 30 and 40 of the object-side unit 170 is incident upon the image-side unit 180 via the projection optical system 150, and split or diffracted by the diffraction grating 50. The beams split by the diffraction grating 50 form the interference pattern on the detector 60. When the calculator 70 calculates or analyzes the interference pattern, the wavefront aberration of the projection optical system 150 can be measured.

A description will now be given of an exposure method of the exposure apparatus 100. In the exposure apparatus 100, plural optical elements (not shown) in the projection optical system 150 are configured to be movable in the optical-axis direction and/or the direction orthogonal to the optical-axis direction. A driving system used to adjust the aberration (not shown) drives one or more optical elements in the projection optical system 150 based on the aberrational information obtained from the object-side unit 170 and the image-side unit 180 (measurement apparatus 1). Thereby, one or more aberrations (in particular Seidel's five aberrations) of the projection optical system 150 are corrected and optimized.

In exposure, the EUV light emitted from the light source section 110 uniformly illuminates the reticle 140 by the illumination optical system 120. The EUV light reflected on the reticle 140 and contains information of the circuit pattern forms an image on the wafer 160 due to the projection optical system 150. The wavefront aberration of the projection optical system 150 used for the exposure apparatus 100 is optimized as described above, and the projection optical system 150 can reflect the EUV light at a high reflectance and a high imaging characteristic. Therefore, the exposure apparatus 100 can provide high-quality devices, such as a semiconductor device and a liquid crystal device, with a high throughput and economical efficiency. In addition, the measurement of the wavefront aberration of the projection optical system 150 uses the simply structured measurement apparatus 1, and can maintain the size and cost of the apparatus.

Fifth Embodiment

Figure 13:
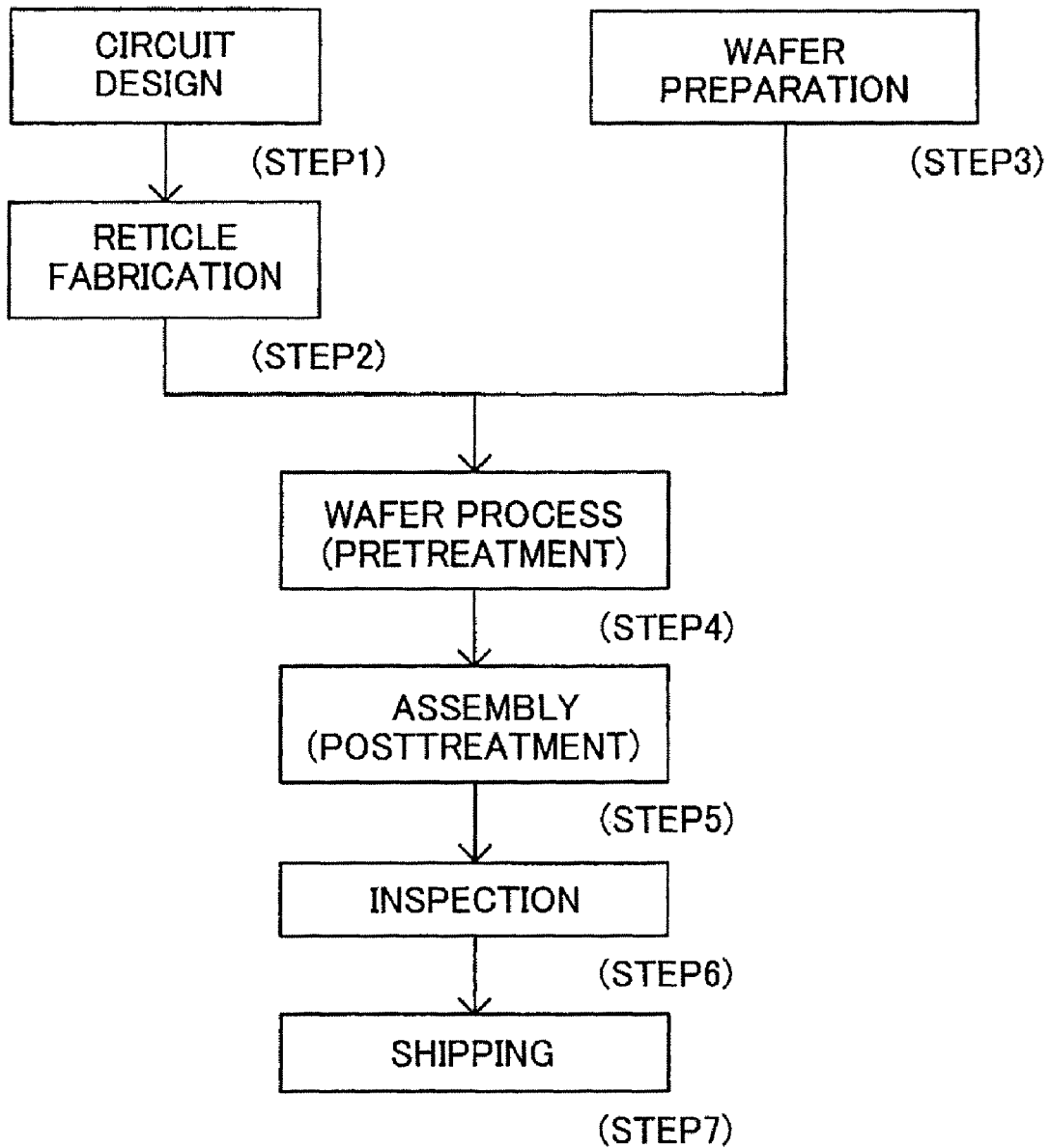
FIG. 13 is a flowchart for explaining a device.
Figure 14:
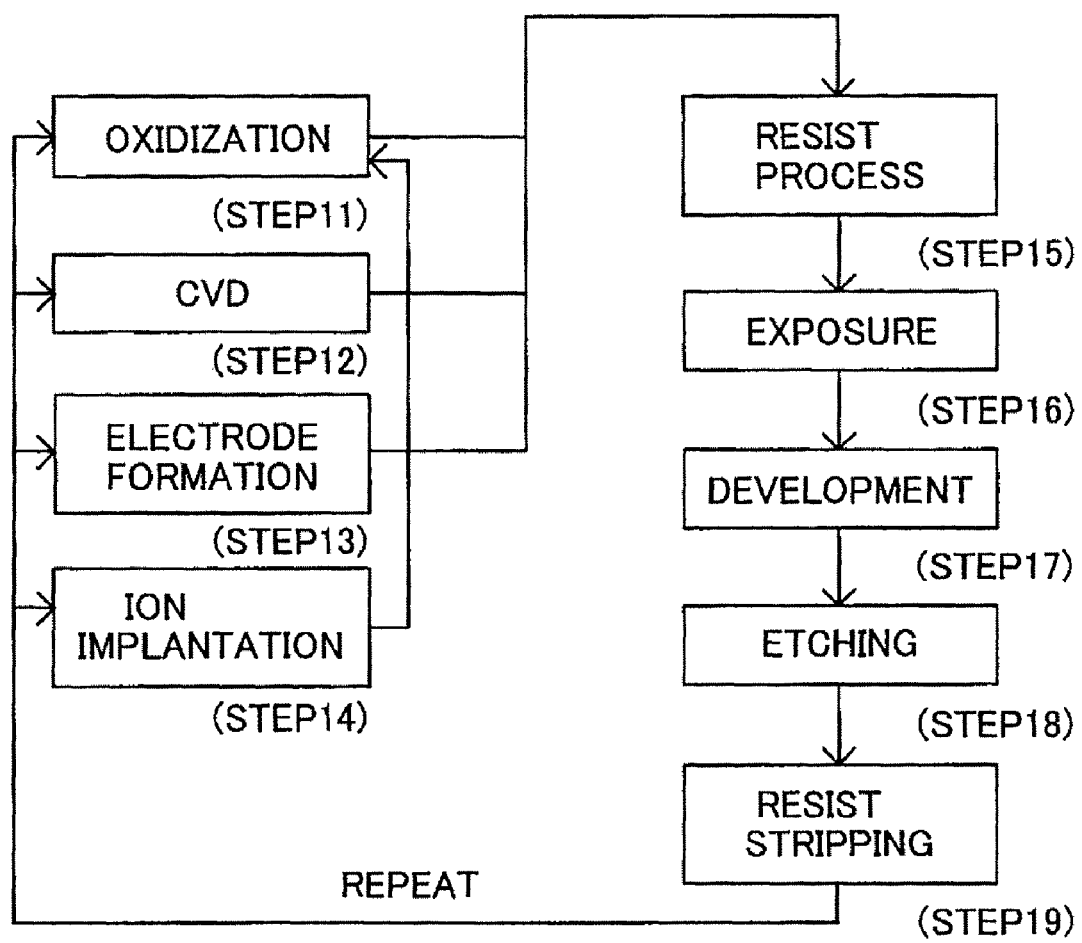
FIG. 14 is a detailed flowchart of a wafer process of step 4 in FIG. 13.

Referring now to FIGS. 13 and 14, a description will be given of an embodiment of a manufacturing method for devices, such as semiconductor devices and liquid crystal display devices, using the above exposure apparatus 100. Here, FIG. 13 is a flowchart for explaining a manufacture of a semiconductor device. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms actual circuitry on the wafer through the photolithography technique using the prepared reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 14 is a detailed flowchart of the above wafer process of the step 4 shown in FIG. 13. Step 11 (oxidation) oxidizes the wafer's surface. Step 12 (CVD) forms an insulating film on the wafer's surface. Step 13 (electrode formation) forms electrodes on the wafer by vapor disposition. Step 14 (ion implantation) implants ions into the wafer. Step 15 (resist process) applies a resist (or a photosensitive material) onto the wafer. Step 16 (exposure) uses the above exposure apparatus 100 to expose a circuit pattern on the reticle onto the wafer. Step 17 (development) develops the exposed wafer. Step 18 (etching) etches parts other than a developed resist image. Step 19 (resist stripping) removes disused resist after etching. These steps are repeated, and multiple layers of circuit patterns are formed on the wafer. The manufacturing method of this embodiment uses the projection optical system that has been adjusted based on the highly measured aberration, and can provide a precise semiconductor device that has been conventionally difficult to manufacture.

As many apparently widely different embodiments of the present invention can be made without departing from the spirit and scope thereof, it is to be understood that the invention is not limited to the specific embodiments thereof except as defined in the claims. For example, the present invention is applicable to a step-and-repeat exposure apparatus.

This application claims a foreign priority benefit based on Japanese Patent Application No. 2006-051426, filed on Feb. 28, 2006, which is hereby incorporated by reference herein in its entirety as if fully set forth herein.

The invention claimed is:

1. A measurement apparatus comprising:
a first mask that is arranged on an object plane of a target optical system, and has plural windows that transmit measurement light;
a second mask that has a reflection surface configured to reflect transmission light that has transmitted plural windows of the first mask, the second mask being provided separate from the first mask, the second mask reflecting the transmission light on the reflection surface and reducing coherence of the reflected light in comparison with the transmission light;

a stage that drives the second mask independently of the first mask; and a diffraction grating configured to split the measurement light that has been reflected on the second mask, has passed the first mask and the target optical system, wherein a distance Lg between the diffraction grating and an image plane of the target optical system satisfies $Lg = m \cdot Pg^2/\lambda$ where Pg is a grating pitch of the diffraction grating, $\lambda$ is a wavelength of the measurement light, and m is an integer except for 0, and wherein a wavefront aberration of the target optical system is calculated from measuring an interference pattern formed through interference of the measurement light split by the diffraction grating, the interference pattern being measured while the stage is driving the second mask.

2. A measurement apparatus according to claim 1, wherein the second mask has a relief structure having a height as high as or higher than the wavelength of the measurement light, and wherein the relief structure is formed at a period of 100 nm.

3. A measurement apparatus according to claim 1, wherein the plural windows are two-dimensionally arranged on the first mask, and the diffraction grating is a two-dimensional grating.

4. An exposure apparatus for exposing a pattern of a reticle onto a substrate using light from a light source, said exposure apparatus comprising:

a projection optical system configured to project the pattern onto the substrate; and a measurement apparatus according to claim 1 configured to detect a wavefront aberration of the projection optical system using the light from the light source.

5. A device fabrication method comprising the steps of:

exposing a substrate by using an exposure apparatus according to claim 4; and developing the substrate that has been exposed.

* * * * *